United States Patent
Lopez

(10) Patent No.: US 10,026,881 B2
(45) Date of Patent: Jul. 17, 2018

(54) LIGHT EMITTING DEVICE WITH REFLECTOR AND A TOP CONTACT

(71) Applicant: KONINKLIJKE PHILIPS N.V., Eindhoven (NL)

(72) Inventor: Toni Lopez, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/566,366

(22) PCT Filed: Apr. 5, 2016

(86) PCT No.: PCT/EP2016/057432
§ 371 (c)(1),
(2) Date: Oct. 13, 2017

(87) PCT Pub. No.: WO2016/165983
PCT Pub. Date: Oct. 20, 2016

(65) Prior Publication Data
US 2018/0097160 A1    Apr. 5, 2018

Related U.S. Application Data

(60) Provisional application No. 62/147,622, filed on Apr. 15, 2015.

(51) Int. Cl.
*H01L 33/00* (2010.01)
*H01L 33/60* (2010.01)
(Continued)

(52) U.S. Cl.
CPC ............. *H01L 33/60* (2013.01); *H01L 33/32* (2013.01); *H01L 33/36* (2013.01)

(58) Field of Classification Search
CPC . H01L 2924/12041; H01L 2224/45144; H01L 2224/48465; H01L 33/405; H01L 33/60
See application file for complete search history.

(56) References Cited

U.S. PATENT DOCUMENTS 6,492,661 B1 * 12/2002 Chien ................. H01L 33/0079
257/103
9,735,327 B2 * 8/2017 Song ...................... H01L 33/60
(Continued)

FOREIGN PATENT DOCUMENTS

EP    2190036 A1    5/2010
EP    2249405 A2    11/2010

OTHER PUBLICATIONS

EPO as ISA, "International Search Report and Written Opinion" dated Jun. 29, 2016 from International Application No. PCT/EP2016/057432, filed Apr. 5, 2016, 10 pages.

*Primary Examiner* — Jaehwan Oh

(57) ABSTRACT

Embodiments of the invention include a semiconductor structure including a light emitting layer disposed between an n-type region and a p-type region. A metal busbar is disposed on the semiconductor structure. A first portion of the metal busbar is in direct contact with the semiconductor structure. A reflector is disposed between a second portion of the metal busbar and the semiconductor structure. A current blocking structure prevents current from being injected in the light emitting layer in a region below the first portion.

14 Claims, 3 Drawing Sheets

(51) Int. Cl.
  *H01L 33/36* (2010.01)
  *H01L 33/32* (2010.01)

(56) References Cited

U.S. PATENT DOCUMENTS

| | | |
|---|---|---|
| 2003/0123505 A1 | 7/2003 | Peters et al. |
| 2008/0265267 A1* | 10/2008 | Unno .................... H01L 33/145 257/98 |
| 2012/0168717 A1* | 7/2012 | Aihara .................... H01L 33/06 257/13 |
| 2013/0001510 A1 | 1/2013 | Chu et al. |

* cited by examiner

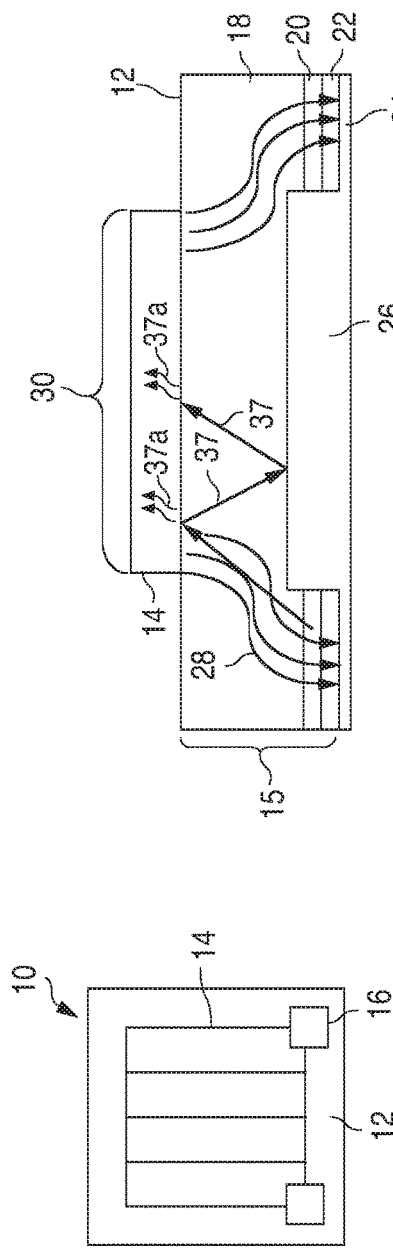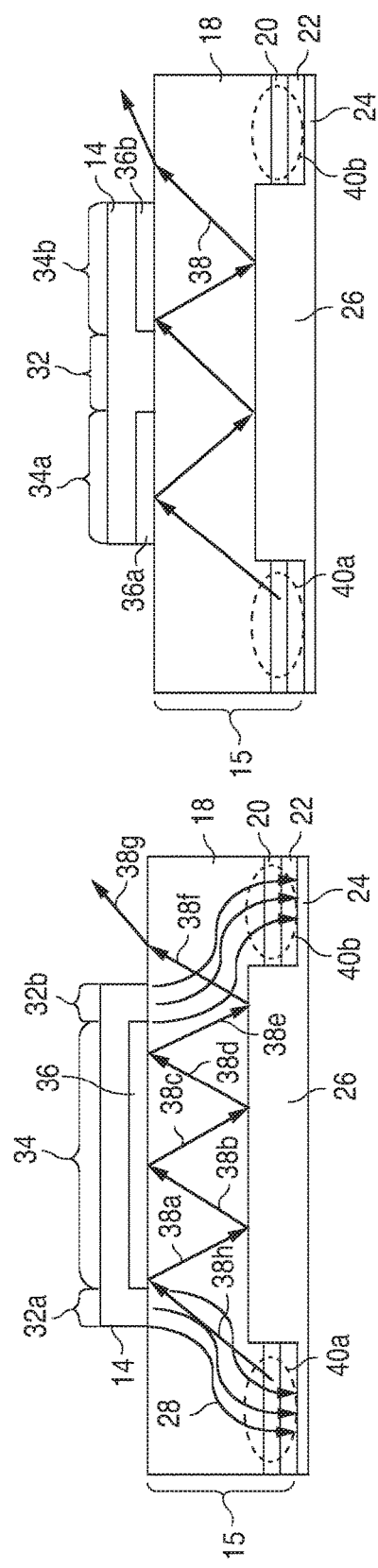

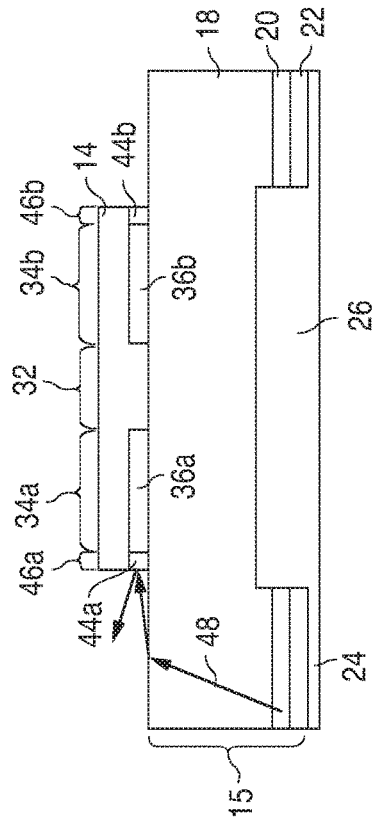
FIG. 5
FIG. 6
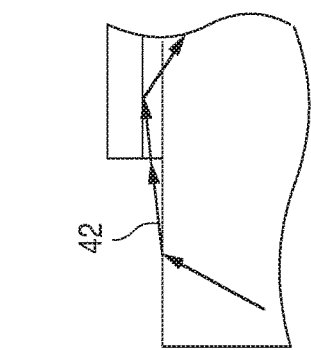
FIG. 7
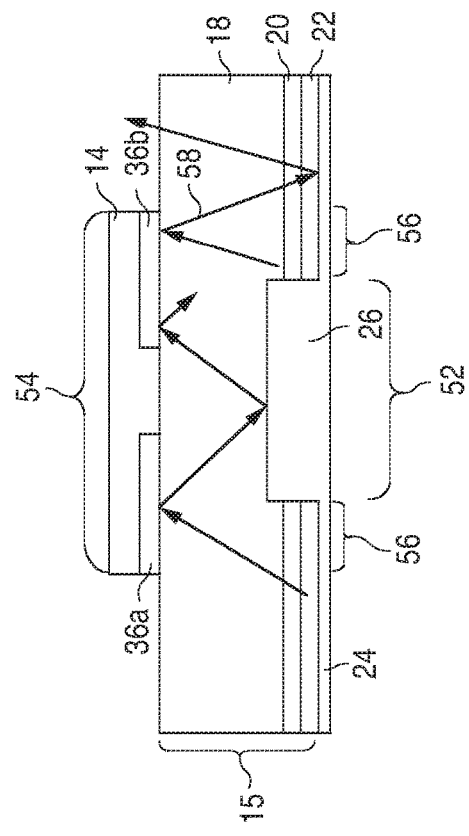
FIG. 8
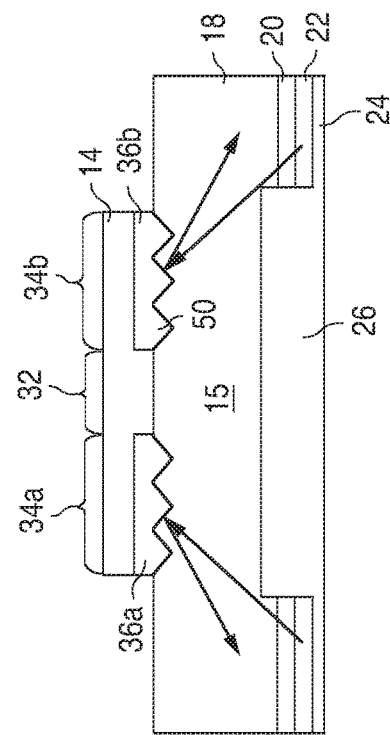

LIGHT EMITTING DEVICE WITH REFLECTOR AND A TOP CONTACT

CROSS-REFERENCE TO RELATED APPLICATIONS

The present application is a § 371 application of International Application No. PCT/EP2016/057432 filed on Apr. 5, 2016 and titled "LIGHT EMITTING DEVICE WITH REFLECTOR AND A TOP CONTACT," which claims the benefit of U.S. Provisional Patent Application No. 62/147,622 filed on Apr. 15, 2015. International Application No. PCT/EP2016/057432 and U.S. Provisional Patent Application No. 62/147,622 are incorporated herein.

FIELD OF THE INVENTION

The present invention relates to a device with a top contact, such as a vertical thin film light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

US 2003/123505 A1 discloses a VCSEL with a tunnel junction that conducts a current in the active region. Tunneling in a selected area of the tunnel junction is disabled to form a current blocking region that confines the current to desired regions of the active region. The blocking region is formed in the tunnel junction.

SUMMARY

It is an object of the invention to provide an efficient semiconductor light emitting device with a top contact.

Embodiments of the invention include a semiconductor structure including a light emitting layer disposed between an n-type region and a p-type region. A metal busbar is disposed on the semiconductor structure. A first portion of the metal busbar is in direct contact with the semiconductor structure. A reflector is disposed between a second portion of the metal busbar and the semiconductor structure. A current blocking structure prevents current from being injected in the light emitting layer in a region below the first portion. The current blocking structure comprises a region where the light emitting layer is removed or not formed. An additional reflector is disposed on the semiconductor structure in the region where the light emitting layer is removed or not formed.

BRIEF DESCRIPTION OF THE DRAWINGS

FIG. 1 is a plan view of a vertical thin film light emitting device.

FIG. 2 is a cross sectional view of a portion of the device illustrated in FIG. 1.

FIGS. 3 and 4 are cross sectional views of a portion of a device with a reflector disposed between a portion of a busbar and the semiconductor structure.

FIG. 5 illustrates a ray incident on a dielectric reflector.

FIG. 6 is a cross sectional view of a portion of a device with a metal reflector and a dielectric reflector disposed between a portion of a busbar and the semiconductor structure.

FIG. 7 is a cross sectional view of a portion of a device with a textured interface between the reflector and the semiconductor structure.

FIG. 8 is a cross sectional view of a portion of a device with a narrow mirror disposed opposite a busbar.

DETAILED DESCRIPTION

Figure 9:
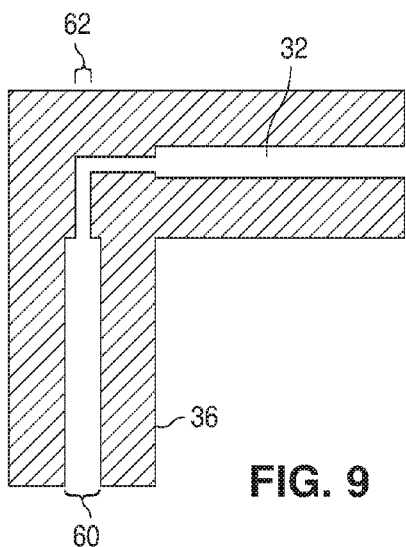
FIG. 9 is a plan view of a portion of a corner of a device.

In semiconductor light emitting devices such as LEDs, keeping the device layers thin may improve light extraction. Thinner layers are less time consuming to grow, which may reduce the cost of the device. The use of thin layers in a device, however, may complicate the design of the device because the current spreading distance in a thin layer is much shorter than the current spreading distance in a thicker layer of the same composition. Uniform current distribution in the active region is desired for optimal efficiency in the device.

Though the figures below illustrate vertical thin film devices, embodiments of the invention may be used in any device with a top contact, such as a device with both n- and p-contacts formed on the surface through which a majority of light is extracted (often referred to as a lateral device).

FIG. 1 is a top view of a vertical thin film (VTF) device 10. In a VTF device, contacts are formed on the top and bottom of the semiconductor structure of the device. The bottom contact may be a reflective sheet contact that covers the entire bottom of the semiconductor structure. On the top 12 of the device, metal busbars 14 are formed, spaced at approximately twice the current spreading length in the semiconductor material on which the busbars are formed. Metal busbars are connected to one or more bonding pads 16, which are used to electrically connect the device to another structure.

FIG. 2 is a cross sectional view of a portion of the device 10 shown in FIG. 1 including a metal busbar 14.

The semiconductor structure 15 includes an n-type region 18, a light emitting or active region 20, and a p-type region 22. The semiconductor structure 15 may be III-nitride material. Active region 20 may emit UV, visible, or blue light. Though the n-type region 18 is shown in contact with busbar 14 and the p-type region 22 is shown in contact with sheet contact 24, in some embodiments, the n- and p-type regions may be reversed such that the p-type region 22 is in contact with busbar 14.

The n-type region 18 may be grown first on a growth substrate and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light. The light emitting or active region 20 is grown over the n-type region. Examples of suitable light emitting regions include a single thick or thin light emitting layer, or a multiple quantum well light emitting region including multiple thin or thick light emitting layers separated by barrier layers. The p-type region 22 may then be grown over the light emitting region. Like the n-type region, the p-type region may include multiple layers of different composition, thickness, and dopant concentration, including layers that are not intentionally doped, or n-type layers.

A reflective back contact 24 is disposed beneath the entire semiconductor structure 15, in contact with p-type region 22. The reflective back contact 24 may be a multi-layer metal structure and may include, for example, one or more of an ohmic layer, a reflective layer, and a guard layer. Any suitable metals or other conductive materials may be used. Silver may be used as the reflective layer.

The growth substrate is removed, exposing a surface of the n-type region 18 on which the busbars 14 and bonding pads 16 may be formed.

Because the busbar 14 is often absorbing of light, in the region beneath the busbar 14, a current blocking structure is formed to prevent the active region 20 from emitting light. For example, the active region 20 may be removed as illustrated in FIG. 2, or otherwise prevented from emitting light. Otherwise, current injected from metal busbar 14 would cause light to be preferentially generated directly beneath the busbar 14, where it would likely be absorbed by the optically lossy busbar 14, rather than extracted from the device.

In the device of FIG. 2, in the region beneath busbar 14, a portion of active region 20 is removed and replaced with a mirror 26 which is disposed upon or is part of contact 24. Current injected by the busbar 14 into n-type region 18 must travel laterally, as indicated by arrows 28, where it is injected into the active region 20 in an area that is not occluded by busbar 14. Any light reflected by mirror 26 into busbar 14 (illustrated by ray 37) may be absorbed (37a) and may create heat, which may reduce the efficiency of the device.

The busbar 14 may be characterized by a transfer length $L_t$, which is equal to the square root of the specific resistance of the busbar 14, divided by the sheet resistance in the semiconductor material in contact with busbar 14. Ideally, the width 30 of busbar 14 is no more than $2L_t$, since current does not spread beyond that length. However, the busbar geometry is limited by manufacturing technology. In addition, busbar conductivity is limited, so width and height of the busbar must be large enough to evenly distribute current through the die area and to keep the forward voltage $V_f$ low. Accordingly, the width of the busbar may be larger than $2L_t$ due to manufacturing limitations and current carrying needs. The large area, absorbing busbars may reduce the efficiency of the device.

In embodiments of the invention, at least a portion of the interface between the busbar and the semiconductor structure is made reflective, to reduce absorption by the busbars.

FIG. 3 illustrates an embodiment of the invention. In the device of FIG. 3, as in the device of FIG. 2, a metal busbar 14 is disposed on the n-type region 18 of a semiconductor structure 15. Also, like in FIG. 2, the current blocking structure is a mirror 26, formed directly beneath busbar 14.

In the device of FIG. 3, a first portion 32a, 32b of metal busbar 14 is in direct contact with the n-type region 18. A reflector 36 is disposed between a second portion 34 of the metal busbar 14 and the semiconductor structure 15. The first portion may have a width $L_t$ and may be disposed on either side of the second portion 34 e.g. first portion may be divided into two sub-portions 32a, 32b where each sub-portion 32a, 32b is disposed on either side of second portion 34 when the busbar cross-section is viewed along its long axis.

The first portion 32a, 32b of the metal busbar 14 in direct contact with the semiconductor structure may be a material that makes excellent electrical contact to the semiconductor material regardless of reflectivity, such as, for example AuZn, AuGe, or any other suitable material. Typically the total width of busbar 14 in direct contact with the semiconductor material is at least $2L_t$ (e.g., the two sub-portions 32a, 32b, are each of width $L_t$), therefore the busbar 14 is substantially electrically equivalent to the structure illustrated in FIG. 2. In some embodiments, the total width of busbar 14 in direct contact with the semiconductor is at least 10 μm and no more than 20 μm.

The reflector 36 may be a reflective material. Suitable reflective materials include a reflective metal such as Au or Ag, a non-metallic material such as an insulator, a low refractive index dielectric material such as $SiO_2$ and/or a thin film distributed Bragg reflector (DBR), or combinations thereof. Reflector 36 is often an insulator or a very poor conductor, such that no current flows in the region of reflector 36, though this is not required —a conductive material that is sufficiently reflective may be used. Light incident on reflector 36, rather than being absorbed, may be reflected between mirror 26 and reflector 36, until it reaches a semiconductor/air interface where it may be extracted, as indicated by rays 38a-38g. Segment 38h is emitted by the active region 20 and incident on reflector 36. Segment 38a is reflected off reflector 36 and incident on mirror 26. Segment 38b is reflected off mirror 26 and incident on reflector 36. Segment 38c is reflected off reflector 36 and incident on mirror 26. Segment 38d is reflected off mirror 26 and incident on reflector 36. Segment 38e is reflected off mirror 26 and incident on reflector 36. Segment 38f is reflected off mirror 26 and incident on the semiconductor/air interface. Segment 38g is extracted into the air.

In the device illustrated in FIG. 3, the first portion 32 of the busbar 14 is divided into two sub-portions that are disposed on either side of the second portion 34, which corresponds to reflector 36. In the device illustrated in FIG. 4, the second portion 34a, 34b, which corresponds to a reflector, is divided into two sub-portions 34a, 34b disposed on either side of the first portion 32, which is in the center of the busbar 14, and which is in direct contact with the n-type region 18 of the semiconductor structure 15. The center, first portion 32 may have a width of at least $2L_t$. Each portion 34a, 34b includes a reflector portion 36a, 36b respectively.

In the devices of FIGS. 3 and 4, regions 40a, 40b of the active region 20 may be an area of high intensity light generation, as it is the area of the active region that is closest to the busbar 14, where current is injected. In some embodiments, it may be preferable to divide the second portion so that the reflectors 36a, 36b may be placed closest to regions 40a, 40b, as in FIG. 4, rather than the absorbing first portion 32, as in FIG. 3, in order to reduce the likelihood of photons emitted in regions 40a, 40b being absorbed.

FIG. 5 illustrates a section of the device illustrated in FIG. 4. FIG. 5 shows that a portion of the light 42 escaping from the semiconductor structure 15 into the air just outside the busbar 14 may be coupled back in to the semiconductor structure through reflector 36 if the reflector 36 is made from transparent dielectric material.

In the device illustrated in FIG. 6, the reflector 36 is a transparent dielectric. The second portion 34a, 34b of the busbar 14, which corresponds to reflector 36a, 36b, is divided into two portions disposed on either side of the first portion 32, which is in the center of the busbar 14, as in FIG. 4. The coupling illustrated in FIG. 5 is avoided by disposing metal reflectors 44a, 44b on the outside of reflector 36 under third portions 46a, 46b. The metal reflectors may be, for example, Ag or Au. In order to avoid significant current flow into the semiconductor structure from metal reflectors 44a, 44b, the width of third portions 46a, 46b is kept less than $L_t$. Light ray 48 that is extracted from the semiconductor structure and incident on reflector 44 is reflected, and not coupled back into the semiconductor structure. The width of third portion 46a, 46b of reflector 44 may be at least 0.5 µm in some embodiments, no more than 2 µm in some embodiments, and no more than 1 µm in some embodiments.

In the device illustrated in FIG. 7, the interface between reflectors 36a, 36b and the semiconductor structure 15 is textured with features 50, which may increase light extraction from the device. The features may be formed in a pattern, or randomly to form a roughened surface. The features may have a cross section shaped as a series of peaks and valleys. The peaks and valleys may interrupt a waveguide formed at the interface between the reflectors 36a, 36b and the semiconductor structure 15, which may scatter light out of the semiconductor structure. The peak to peak width of each feature may be at least 0.5 µm in some embodiments, no more than 2 µm in some embodiments, and no more than 1 µm in some embodiments. The texturing may be formed by lithography, mechanical processes such as grinding, or any other suitable process, before forming the reflector.

In some embodiments, the mirror 26 opposite the busbar 14 may be reduced so as to maximize the active region 20, since the likelihood of absorption of light produced beneath the busbar 14 is reduced by the presence of reflector 36. In the device illustrated in FIG. 8, the mirror 26 has a width 52 narrower than the width 54 of busbar 14. Mirror 26 is centered beneath busbar 14 in FIG. 8, though this is not required. Light generated in portion 56 of active region 20, which is disposed beneath the busbar 14, may not be absorbed by busbar 14, as illustrated by ray 58. Width 52 may be no more than 90% of width 54 in some embodiments, no more than 75% of width 54 in some embodiments, no more than 60% of width 54 in some embodiments, and at least 40% of width 54 in some embodiments. Width 54 may be at least 10 µm in some embodiments and no more than 20 µm in some embodiments. Width 52 may be at least 5 µm in some embodiments, and less than 10 µm in some embodiments.

In some embodiments, the busbars are designed to reduce current crowding, as illustrated in FIG. 9. FIG. 9 illustrates the interface of the busbar 14 with the semiconductor structure 15. In first portion 32, the metal busbar 14 is in direct contact with the semiconductor structure. Reflector 36a, 36b is disposed on either side of the first portion 32. In the device of FIG. 9, in the corner of the device, a region that is generally subject to current crowding, the width 62 of the first portion 32, through which current is injected into the semiconductor structure, is reduced as compared to the width 60 of the first portion 32 away from the corners of the device. The amount of current injected in the corner is therefore reduced, which may reduce current crowding in the corner of the device. Width 60 may be at least 10 µm in some embodiments and no more than 15 µm in some embodiments. Width 62 may be at least 5 µm in some embodiments, and no more than 10 µm in some embodiments.

Figure 10:
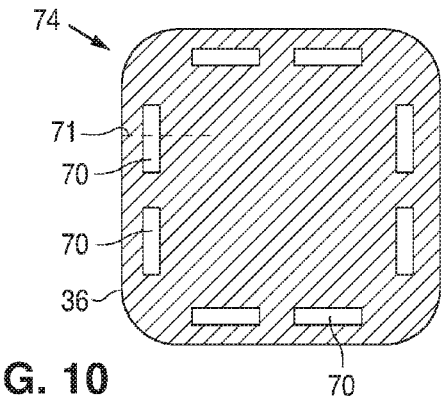
FIG. 10 is a plan view of a bottom surface of a bonding pad.
Figure 11:
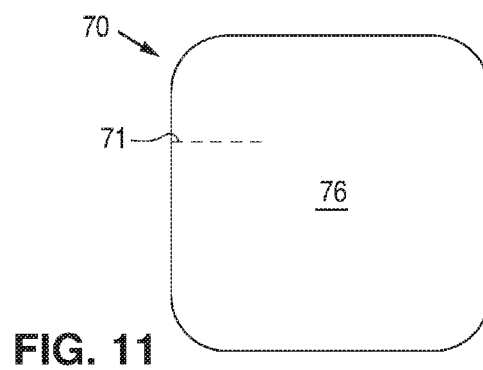
FIG. 11 is a plan view of a top surface of a bonding pad.

In some embodiments, one or more bonding pads in the device also include a reflector disposed between a portion of the bonding pad and the semiconductor structure. For example, the plan view of FIG. 1 includes two bonding pads 16. FIGS. 10 and 11 are plan views of the bottom layer 36 (in contact with the semiconductor structure) and top layer 76 (opposite the bottom surface), respectively, of a bonding pad 16.

Figure 13:
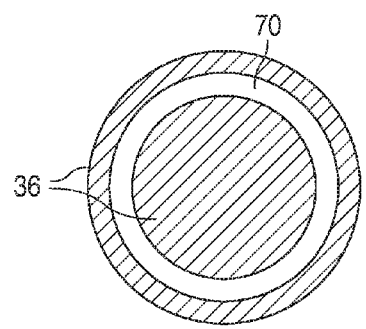
FIGS. 13 and 14 are plan views of the bottom surfaces of bonding pads.
Figure 12:
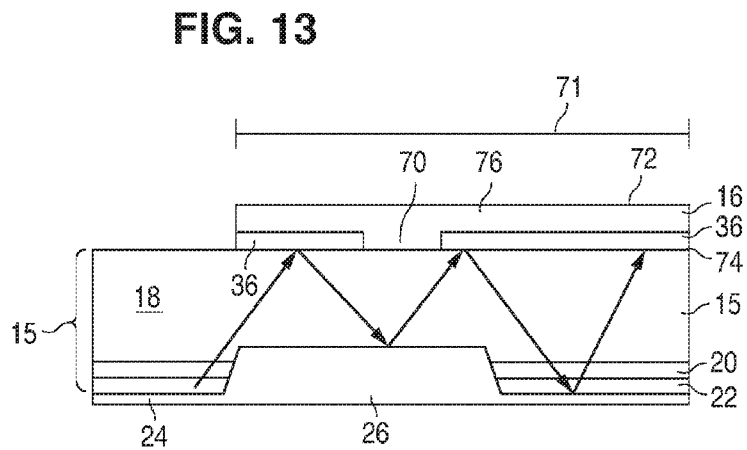
FIG. 12 is a cross sectional view of a portion of a device including a bonding pad.
Figure 14:
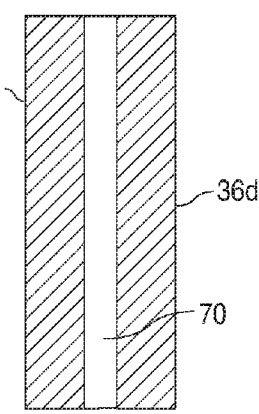

FIG. 12 is a cross sectional view of a portion of a bonding pad 16. The location of portion 71 is indicated in FIGS. 10, 11, and 12. A plan view of the bottom layer of the bonding pad, at the interface 74 between the bonding pad 16 and the semiconductor structure 15, is illustrated in FIG. 10. A plan view of the top layer 72 of the bonding pad is illustrated in FIG. 11. At the bottom surface of bonding pad 16, illustrated in FIG. 10, in eight regions 70, the metal 76 that forms the bonding pad top layer is in direct contact with the semiconductor structure 15. Current is injected into the semiconductor structure 15 in regions 70. A reflector 36, disposed between the semiconductor structure 15 and the bonding pad 16, surrounds regions 70. At the top of bonding pad 16, illustrated in FIG. 11, the bonding pad metal 76 covers the reflector 36, such that the entire top surface is metal 76, and is therefore available for bonding. In some embodiments, between 80% and 90% of the bottom surface of the bonding pad is reflector 36. FIG. 13 illustrates the bottom surfaces of an alternative bonding pad 16. FIG. 14 illustrates the bottom surface of an alternative bonding pad 16, or the bottom surface of a busbar 14. In FIG. 13, the bonding pad is round. In an annulus 70, the bonding pad metal 76 makes direct contact with the semiconductor structure, in a manner similar to that illustrated in FIG. 12. The reflector 36 is disposed on either side of annulus 70. The reflector 36 may be covered by the bonding pad metal 76, similar to that illustrated in FIG. 12. In FIG. 14, the bonding pad is rectangular. In a center strip 70, the bonding pad metal 76 makes direct contact with the semiconductor structure. The reflector 36c, 36d is disposed on either side of strip 70.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Having described the invention in detail, those skilled in the art will appreciate that, given the present disclosure, modifications may be made to the invention without departing from the spirit of the inventive concept described herein. Different elements of different embodiments may be combined, and elements described in particular embodiments may be omitted from those embodiments. Therefore, it is not intended that the scope of the invention be limited to the specific embodiments illustrated and described.

The invention claimed is:

1. A device comprising:
   a semiconductor structure comprising a light emitting layer disposed between an n-type region and a p-type region;
   a metal region disposed on the semiconductor structure in direct contact with the semiconductor structure;
   a reflector over the semiconductor structure;
   an additional reflector disposed over the semiconductor structure opposite the metal region; and
   a current blocking structure, wherein the current blocking structure prevents current from being injected in a region of the light emitting layer,
   wherein,
   a first portion of the metal region is in direct contact with the semiconductor structure,
   the reflector is disposed between a second portion of the metal region and the semiconductor structure,
   the current blocking structure comprises a region where the light emitting layer is removed or not formed; and
   the additional reflector is disposed on the semiconductor structure in the region where the light emitting layer is removed or not formed.

2. The device of claim 1 wherein the additional reflector is narrower than the metal region.

3. The device of claim 1 wherein the reflector is selected from the group consisting of metal, Ag, Al, Au, dielectric, $SiO_2$, and DBR.

4. The device of claim 1 wherein:
   the second portion is located at a center of the metal region; and
   the first portion is located at an edge of the metal region.

5. The device of claim 1 wherein:
   the first portion is located at a center of the metal region; and
   the second portion is located at an edge of the metal region.

6. The device of claim 1 wherein the first portion has a width twice a transfer length of the metal region, wherein the transfer length is equal to a square root of a specific resistance of the metal region, divided by a sheet resistance in a portion of the semiconductor structure in contact with the metal region.

7. The device of claim 1 wherein the first portion has a width of at least 10 μm and no more than 20 μm.

8. The device of claim 1 wherein the reflector is an insulating layer, the device further comprising a metal reflector disposed between a third portion of the metal region and the semiconductor structure.

9. The device of claim 8 wherein the first portion is disposed in a center of the metal region, the third portion is disposed on an edge of the metal region, and the second portion is disposed between the first portion and the third portion.

10. The device of claim 8 wherein the third portion has a width less than a transfer length of the metal region, wherein the transfer length is equal to a square root of a specific resistance of the metal region, divided by a sheet resistance in a portion of the semiconductor structure in contact with the metal region.

11. The device of claim 1 wherein an interface between the reflector and the semiconductor structure is textured.

12. The device of claim 1 wherein the first portion is narrower in a first area of the metal region than in a second area of the metal region, wherein the first area is closer to a corner of the device than the second area.

13. The device of claim 12 wherein in the first area, the first portion comprises a first segment and a second segment connected by a right angle.

14. The device of claim 12 wherein the first portion has a width between 5 μm and 10 μm in the first area, and the first portion has a width between 10 μm and 15 μm in the second area.

* * * * *